United States Patent [19]

Demaray et al.

[11] Patent Number: 5,799,860

[45] Date of Patent: Sep. 1, 1998

[54] PREPARATION AND BONDING OF WORKPIECES TO FORM SPUTTERING TARGETS AND OTHER ASSEMBLIES

[75] Inventors: Richard Ernest Demaray, Portola Valley; Akihiro Hosokawa, Cupertino; Manuel J. Herrera, San Mateo, all of Calif.

[73] Assignee: Applied Materials, Inc., Santa Clara, Calif.

[21] Appl. No.: 511,824

[22] Filed: Aug. 7, 1995

[51] Int. Cl.$^6$ .............................. B23K 20/14; B23K 20/16
[52] U.S. Cl. .................. 228/194; 228/205; 228/221; 228/262.7
[58] Field of Search ............................ 228/193, 194, 228/221, 205, 262.7

[56] References Cited

U.S. PATENT DOCUMENTS

| | | | |
|---|---|---|---|
| H340 | 10/1987 | MacKenzie et al. | 228/44.3 |
| 3,672,045 | 6/1972 | Robertson | 29/603.11 |
| 3,678,570 | 7/1972 | Paulonis et al. | 29/498 |
| 3,713,207 | 1/1973 | Ruckle et al. | 29/498 |
| 3,762,032 | 10/1973 | Bowling et al. | 29/493 |
| 3,971,875 | 7/1976 | Regalbuto | 13/31 |
| 4,011,982 | 3/1977 | Marancik | 228/208 |
| 4,087,037 | 5/1978 | Schier et al. | 228/106 |
| 4,088,258 | 5/1978 | Regalbuto | 228/193 |
| 4,089,456 | 5/1978 | Toppen et al. | 228/195 |
| 4,166,563 | 9/1979 | Peyraud et al. | 228/221 X |
| 4,220,276 | 9/1980 | Weisert et al. | 228/118 |
| 4,245,769 | 1/1981 | Meginnis | 228/173 |
| 4,691,857 | 9/1987 | Friedman | 228/265 |
| 4,709,844 | 12/1987 | Sekiguchi et al. | 228/221 X |
| 4,756,680 | 7/1988 | Ishiii | 425/78 |
| 4,869,421 | 9/1989 | Norris et al. | 228/181 |
| 4,921,666 | 5/1990 | Ishii | 419/25 |
| 4,934,579 | 6/1990 | Doble | 228/135 |
| 4,948,031 | 8/1990 | De Clerck | 228/194 |
| 5,058,411 | 10/1991 | Siemers et al. | 72/342.4 |
| 5,151,332 | 9/1992 | De Clerck | 428/650 |
| 5,161,908 | 11/1992 | Yoshida et al. | 403/29 |
| 5,230,459 | 7/1993 | Mueller et al. | 228/164 |
| 5,263,638 | 11/1993 | Douglas | 228/118 |
| 5,269,899 | 12/1993 | Fan | 204/296 |
| 5,433,835 | 7/1995 | Demaray et al. | 204/298.09 |
| 5,487,822 | 1/1996 | Demaray et al. | 204/298.09 |

FOREIGN PATENT DOCUMENTS

| | | |
|---|---|---|
| 0 091 371-A1 | 10/1983 | European Pat. Off. . |
| 0 590 904-A1 | 4/1994 | European Pat. Off. . |
| 63-270459-A | 11/1988 | Japan . |
| 02 122 0721-A | 5/1990 | Japan . |
| 930 343 449 | 12/1993 | Japan . |

*Primary Examiner*—Kenneth J. Ramsey
*Attorney, Agent, or Firm*—Donald E. Verplancke; Charles S. Guenzer

[57] ABSTRACT

A sputtering target assembly is fabricated by diffusion bonding a target material plate to a backing plate. The plates are cleaned in a vacuum environment, and an interlayer is formed on one or more of the plates. The plates are then joined under heat and pressure, before an oxide layer can form on the joining surfaces of the plates. The plates may be sequentially processed through cleaning, interlayer deposition, and bonding chambers, all with vacuum environments, to form the finished part, or, a single chamber may be used to provide the cleaning, interlayer deposition and bonding functions.

16 Claims, 11 Drawing Sheets

PREPARATION AND BONDING OF WORKPIECES TO FORM SPUTTERING TARGETS AND OTHER ASSEMBLIES

BACKGROUND OF THE INVENTION

1. Field of the Invention

The present invention relates to the diffusion bonding of workpieces to form composite structures. More particularly, the present invention relates to the diffusion bonding of workpieces, including large planar workpieces, to form sputtering target assemblies useful for the deposition of film layers on substrates. More particularly still, the present invention provides methods and apparatuses for fabricating a sputtering target assembly having a bond between the elements thereof which has high strength at high temperatures.

2. Background of the Art

The fabrication of integrated circuit devices on substrates requires the deposition of film layers on substrates. These film layers may be provided by various techniques, among them sputtering. To provide a deposition layer by sputtering, the substrate is placed into a vacuum chamber having a sputtering target assembly therein. The sputtering target assembly includes a backing plate, which may form a structural component of the chamber, and a target material plate adhered to the face of the backing plate and exposed to the interior of the chamber. A cooling plate, through which a coolant may be flowed, may be affixed to the non-exposed side of the backing plate, to permit cooling of the target assembly. Demaray et. al. describe such a sputtering target assembly in U.S. Pat. No. 5,433,835 and in U.S. patent application Ser. No. 08/236,715 filed Apr. 29, 1994, incorporated herein by reference.

To sputter the target material plate, a plasma is maintained in the chamber and ions from the plasma bombard the target plate to free atoms or larger particles of target material from the target material plate. A portion of these freed atoms and particles deposit on the substrate to form useful film layers on the substrate.

The rate at which the film layer forms on the substrate is a partial function of the power density of the plasma. The higher the power density of the plasma, the greater the deposition rate of sputtered material on the substrate. To maximize the throughput of substrates through the chamber, the power density of the plasma should be maintained as high as possible within the capabilities of the processing chamber.

One limitation on the maximum power density of the plasma is the maximum acceptable temperature of the target assembly. The target material plate is typically joined to the backing plate by flowing an indium-containing solder over the target plate, and then pressing the backing plate against the molten solder layer and the target material plate to form a mechanical solder joint between the two plates. When the resulting target assembly is placed in a chamber, the backing plate is attached to the walls or cover of the chamber, such that the target material plate is suspended in the chamber by the mechanical solder joint between the target material plate and the backing plate. Therefore, the solder joining the target material plate to the backing plate must be capable of supporting the mass of the target material plate hanging therefrom in the chamber.

As the temperature of the target assembly approaches 100° C., the indium solder becomes soft and its tensile strength drops significantly. At temperatures significantly below 100° C., i.e., 20° to 60° C., the indium solder usually has sufficient strength to support the target material plate without the target material plate creeping or otherwise separating from the backing plate. However, if the solder between the target material plate and the backing plate is maintained at, or above, 100° C. for a significant period of time, the target material plate may creep from, and then separate from, the backing plate. Additionally, if the coefficients of thermal expansion of the target material plate and the backing plate are not closely matched, the two plates will attempt to differentially expand along the joint between the plates. Because the indium based solder has a relatively low shear strength, particularly at temperatures at, or above, 100° C., the forces created by the differential linear expansion of the plates may be sufficient to shear the mechanical solder connection between the plates, even though the indium solder may undergo significant plastic strain before failure, again leading to separation of the target material plate from the backing plate. To prevent separation of the target material plate from the backing plate, the two plates must be manufactured from materials having similar coefficients of thermal expansion, and the plasma power density must be maintained low enough to prevent overheating of the solder joint.

To avoid the above-referenced limitations of indium based solders, target assembly fabricators have used higher shear strength solders, such as tin-silver solders, as a mechanical joining material between the target material plate and the backing plate. Tin-silver solders have a significantly higher shear strength and tensile strength at higher temperatures as compared to the indium based solders, but they also have inherent fabrication limitations. In particular, the tin-silver solder does not wet as well, i.e., it does not flow over, and mechanically adhere to, all of the exposed surface of the areas to be joined with the solder, and shear forces created by the thermal expansion mismatch between the target material plate and the backing plate cannot be accommodated by any significant plastic strain as with indium solders. Therefore, the solder joint will be created with significant higher stresses and normally a smaller portion of the joining area between the two plates will be bonded, i.e., more solder joint voids. If the area of the mechanical solder joint has many voids, the joint may not be capable of maintaining the target material plate on the backing plate, and the target material plate may separate from the backing plate and fall into the chamber.

Adhesives have been used to attach the backing plate to the target material plate. However, most adhesives are often unacceptable joining materials where the target assembly is used for integrated circuit device fabrication, because the adhesives outgas volatile components and chain molecules when exposed to a vacuum. These outgassed materials would contaminate a deposition layer used to fabricate an integrated circuit device. Therefore, adhesive bonded target assemblies may be used mainly for non-integrated circuit device fabrication, such as for forming film layers on architectural glass.

One alternative to the use of adhesives and solders for joining a target material plate to a backing plate is diffusion bonding. Diffusion bonding is a method of joining workpieces of similar or dissimilar materials to provide a composite structure which has, for example, high strength characteristics on a portion thereof, but high wear resistance characteristics on another portion thereof. Diffusion bonding has been used in the aerospace industry for several decades to form composite structural members for aircraft wings and other airframe components. Unlike solder or other mechanical joining means, a diffusion bond includes actual atomic diffusion of the materials being joined into each other.

U.S. Pat. No. 5,230,459 discloses a bi-metallic sputtering target assembly wherein a target material plate of one material is diffusion bonded to a backing plate of another material. The target assembly includes a backing plate formed of one material, and a target material plate formed of the sputtering material. A plurality of ridges are provided on the joining surface of the target material plate such that, when the target material plate is forced into intimate contact with the backing plate, the ridges dig into the adjacent surface of the backing plate. The ridges must be present to allow the surface of the backing plate to be disrupted by the engagement of the ridges therewith, because an oxide layer which forms on the backing plate surface must be disrupted to allow intimate contact between the backing plate and the target material plate. Without intimate contact between the materials of the two plates, atomic diffusion, and thus bonding, will not occur between the two plates to form the diffusion bond. Therefore, this joining method requires significant forces and significant unit loading of the backing plate and the target material plate in order to force the ridges through the oxide layer.

The traditional methods of forming film layers on substrates, including sputtering, have been incorporated into the fabrication methods used to create flat panel displays. Today, four 11.25" (286 mm) diagonal flat panel displays are fabricated from a glass substrate typically sized on the order of 400 mm by 500 mm or larger. The displays are fabricated by cycling a glass substrate of the above mentioned size through traditional deposition and etch cycles to form four display circuit devices on the substrate. Because of the size of the substrate, only a few flat panel displays may be fabricated at one time. The sequential fabrication of glass substrates is time consuming, but is necessitated by the sizes of traditional device fabrication equipment because the surface area of the sputtering target must normally be larger than the surface area being sputter coated. For example, if the substrate is sized to simultaneously fabricate four 11.25" diagonal flat panel displays on a single substrate, the sputtering surface area of the target must be larger than approximately 500 mm by 600 mm. Likewise, if the substrate is sized to provide nine 11.25" diagonal flat panel display devices on one substrate, the target must be larger than approximately 700 mm by 870 mm.

The solder and adhesive joining systems are not entirely acceptable for target assemblies on the order of 700 mm by 870 mm for flat panel display fabrication. The adhesive joining system is unacceptable because the adhesives may release materials into the sputtering chamber which would contaminate the sputtered film layer. The solders are also unacceptable because a) larger plates will undergo significant more deflection due to thermal expansion mismatch between the target material and the backing plate, resulting in larger shear stresses than the solder joint can sustain, and b) larger plates are also more difficult to handle and more voids are likely in the solder joint resulting in more sites where failure can originate. With increased deflection of the plates and corresponding significant larger shear stresses, the indium solder is more likely to fail and allow the target material plate to separate from the backing plate in the chamber. The silver based solders are likewise unacceptable because the wetting problem associated therewith is exacerbated by the substantially larger target size.

The diffusion bonding fabrication procedure disclosed in U.S. Pat. No. 5,230,459 may be used to form target assemblies where the diameter of the sputtering target is on the order of 250 mm in diameter. As the target diameter becomes larger, the area of the backing plate and target plate which must be joined increases as the square of any increase in target diameter. At a certain point, the force necessary to push the ridges through the adjacent surface of the backing plate will exceed the capacity of most bonding presses. Where the target assembly is used to form film layers on semiconductor substrates, which typically are no greater than 200 mm in diameter, the magnitude of the force needed to force the ridges into the backing plate may be obtained using standard presses in a vacuum furnace. However, if the target is to be used for larger substrates, such as flat panel display substrates, the force required to bond the larger target material plate and backing plate may exceed the capacity of existing presses. Therefore, this diffusion bonding method is impracticable for larger targets.

Additionally, this bonding method has limited applicability where the materials being joined are either substantially soft or brittle because the forces needed to bond the parts may be great enough to cause permanent deformation of the parts or fracture of the material. Moreover, the temperatures needed to bond the parts, on the order of 500° C., when combined with the time of the materials at that temperature, may detrimentally change the metallurgical characteristics of the materials, such as by allowing the materials to pass through phase changes, or excessive grain growth.

Therefore, there exists a need in the art to provide apparatus and methods for fabricating sputtering target assemblies which provide a strong, high temperature capable bond between the target assembly elements while minimally affecting the integrity of the bonded materials.

SUMMARY OF THE INVENTION

The present invention provides methods and apparatus for the diffusion bonding of workpieces, including large scale planar workpieces or substantially planar portions of workpieces having out-of-plane portions that are not to be bonded. The bonding is accomplished with increased efficiency and reduced cost. In a first embodiment of the invention, the workpieces are cleaned by ion-bombardment etching, and an interlayer is preferably formed on one of the workpieces by sputtering. Both the ion bombardment cleaning and the sputtering are carried out in an oxygen-free, or nearly oxygen-free, environment, to prevent or substantially limit the creation of an oxide layer on either workpiece. The workpieces are then transferred, under oxygen-excluding conditions, into a bonding press where the bonding surfaces of the workpieces are contacted under pressure and temperature to form a diffusion bond between the two workpieces.

In a second embodiment of the invention, the bonding press uses members having different coefficients of thermal expansion to supply the force, and thus the necessary unit force (pressure) at the adjoining areas of the workpieces, for diffusion bonding. Further, the press includes differential loading members which may be used, if necessary, to deform the workpiece during the diffusion bonding operation so that the resulting bonded member returns to the desired shape and flatness as it cools.

In a third embodiment of the invention, one of the structural components being bonded is configured as a sputtering target in a vacuum enclosure, and the second structural component is loaded into the vacuum enclosure. The two components are sputter cleaned, and then the first structural component is sputtered to deposit a layer of material sputtered from the first member onto the second member. Once the sputtering is completed, the two workpieces are brought together under pressure to join them into a monolithic member. The monolithic workpiece is removed, and a new pair of workpieces are placed into the chamber for processing.

BRIEF DESCRIPTION OF THE DRAWINGS

These and other features and advantages of the invention will become apparent from the description of the embodiments, when read in conjunction with the following drawings, wherein.

DESCRIPTION OF THE PREFERRED EMBODIMENTS

The present invention provides multiple embodiments of diffusion bonding apparatuses and methods for preparing structures, such as sputtering targets, from individual workpieces using diffusion bonding techniques. Although the embodiments of the invention are primarily illustrated and described with respect to planar structures, including the sputtering target assembly 1 shown in FIG. 1, the apparatuses and the methods of the present invention may also be used to join together non-planar members. Additionally, the present invention provides methods and apparatuses useful for diffusion bonding workpieces used in many industries, and is not limited to the semiconductor wafer processing, flat panel display processing or the sputtering target industries.

THE EXEMPLARY STRUCTURE, A TWO PIECE TARGET ASSEMBLY

Figure 1:
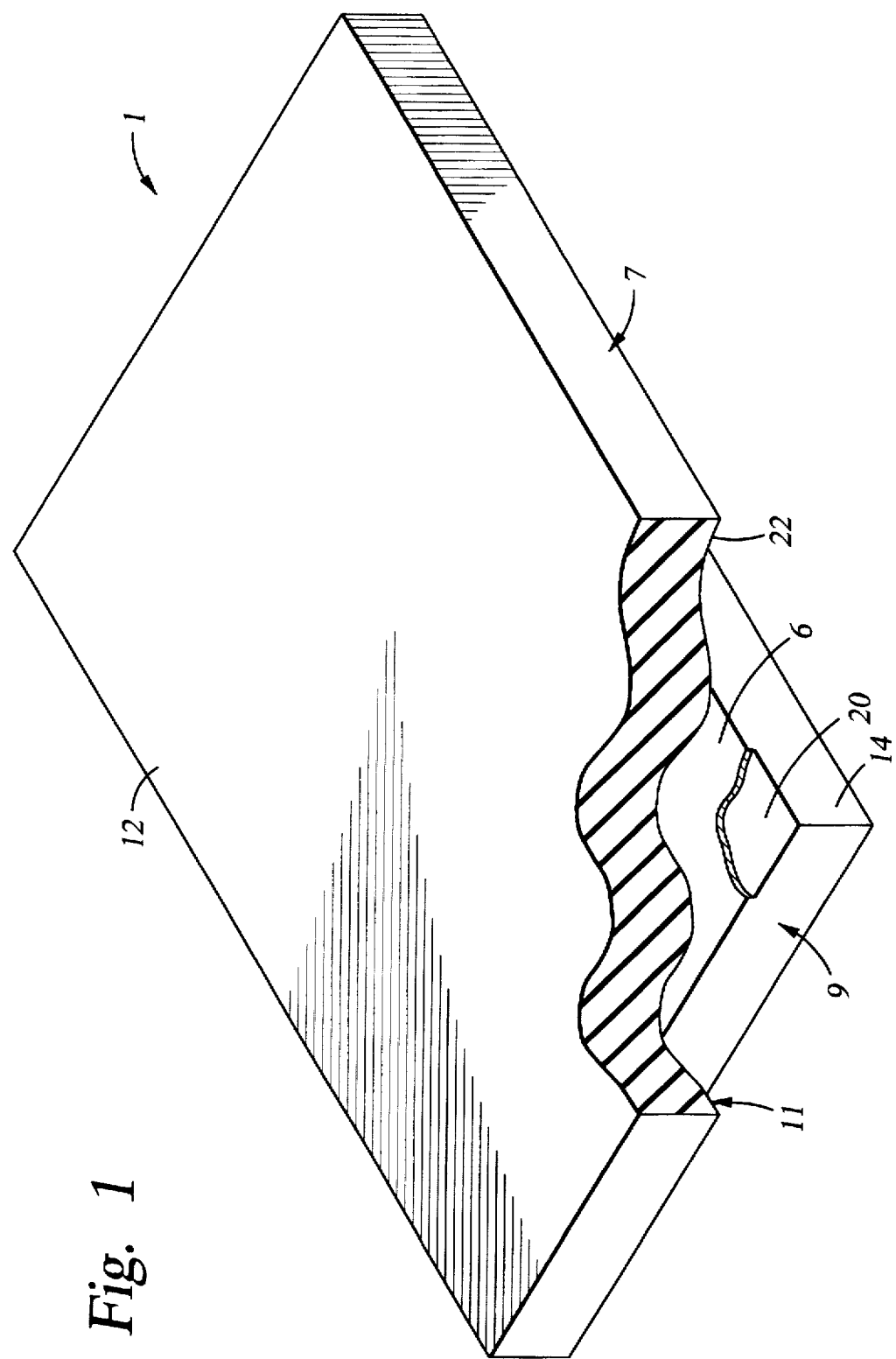
FIG. 1 is a perspective view, partially in section, of a sputtering target assembly which may be manufactured using the vacuum handling tool of the present invention.

Referring to FIG. 1, an exemplary target assembly 1 which may be prepared using the apparatus and methods of the invention is shown in a partially cutaway perspective view. The target assembly 1 includes a backing plate 12 bonded to a target material plate 14. An interlayer 6 is provided between the target material plate 14 and the backing plate 12. The perimeter 7 of the backing plate 12 extends outwardly from the perimeter 9 of the target material plate 14, to create an annular mounting flange 11 for mounting of the target assembly 1 within a sputtering chamber. The sputtering target assembly 1 may be used for semiconductor device fabrication, including semiconductor wafer and flat panel display substrate film layer deposition, wherein the mounting flange 11 is used to mount, and suspend, the target assembly 1 in the chamber. Additionally, a cooling plate (not shown), having a plurality of cooling channels therein, may be located on the back side of the backing plate 12. The cooling plate may be adhered to the back of the backing plate with solder or adhesives, physical means such as screws, or with the diffusion bonding techniques described herein. The joint between the backing plate 12 and the cooling plate is not exposed to the chamber conditions, and therefore adhesives may be used. By flowing chilled water, or other coolant, through the cooling plate, the temperature of the target assembly 1 may be controlled.

THE PROCESSING SEQUENCE AND APPARATUS: AN OVERVIEW

Figure 2:
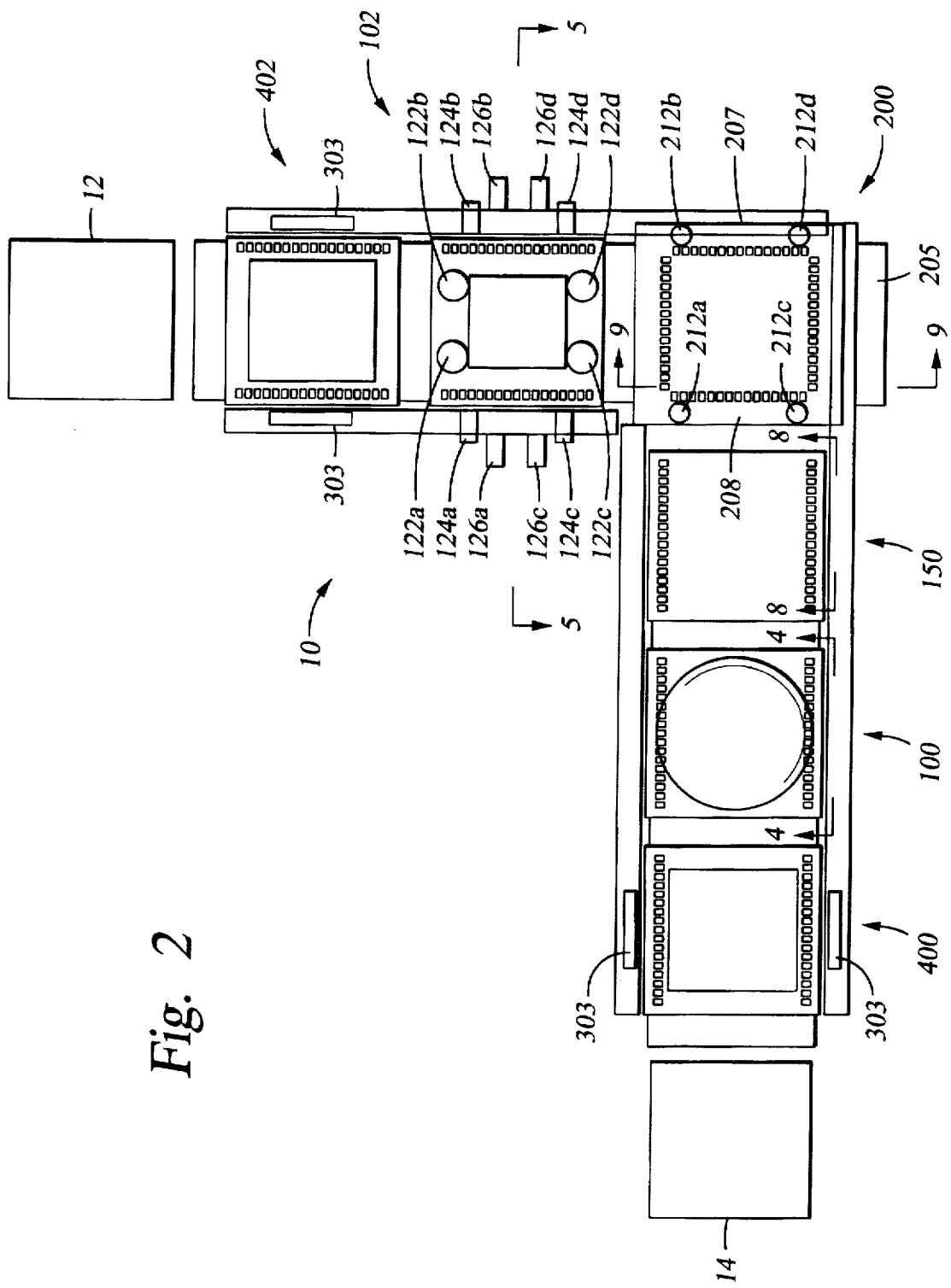
FIG. 2 is a top view, partially in section, of a vacuum handling tool for preparing and bonding together two workpieces.

Generally, the bonding process of the present invention includes the steps of cleaning the bonding surfaces of each of the workpieces to be bonded together, forming an interlayer of a selected material on the cleaned surface of at least one of the workpieces, and then bonding the two workpieces together at their bonding surfaces. FIG. 2 shows one embodiment of the invention, wherein a vacuum handling tool 10 having multiple work stations, or chambers, is provided for performing each of the steps of cleaning, forming an interlayer on, and bonding of the workpieces. Specifically, the configuration shown in FIG. 2 reflects a series of work stations for loading a target material 14 at loading work station 400, cleaning the target material 14 at cleaning work station 100, forming an interlayer on the target material at deposition work station 150, and bonding the target material 14 with a backing plate 12 at a bonding chamber work station 200. The backing plate 12 enters the system through a loading chamber 402 and is subsequently cleaned at cleaning work station 102 before entering the bonding chamber work station 200.

Each of the aforementioned process steps is preferably performed in a vacuum, or in a reducing or non-oxidizing environment, and the workpieces are preferably maintained in the vacuum or reducing environment both during the processing steps and as they are shuttled between process apparatuses configured to provide the process steps. In the preferred embodiment of the invention, the backing plate 12 and target material plate 14 are the workpieces joined in a vacuum handling tool 10. The vacuum handling tool 10 includes a plurality of dedicated work stations, or chambers, in which individual processes are performed on the backing plate 12 and target plate 14 to prepare them for bonding, and a bonding chamber 200, within which the backing plate 12 and target material plate 14 are brought together under heat and pressure to diffusion bond them together into a target assembly 1.

In the embodiment of the invention described herein with reference to the vacuum handling tool 10, only two members, i.e., the backing plate 12 and the target material plate 14, are joined in the cluster tool 10. However, the vacuum handling tool 10 may be modified, as will be further described herein, to prepare, and bond together, three or more workpieces, such as a backing plate 12, a target material plate 14 and a cooling plate (not shown).

To join two workpieces, such as a backing plate 12 and a target material plate 14, the vacuum handling tool 10 includes two cleaning chambers 100, 102, one interlayer deposition chamber 150, and one bonding chamber 200, all of which are linked by a substrate transfer system. To perform the bonding of the workpieces, the backing plate 12 is loaded, through a load lock chamber 402, having vacuum slit valves at either end, i.e., at the entrance to the loadlock chamber and at the interface with cleaning chamber 102. The target material plate 14 is then loaded, through a second loadlock chamber 400, into the other cleaning chamber 100. Both the backing plate 12 and the target material plate 14 are sputter cleaned, in a non-oxidizing environment, to provide oxide-free surfaces thereon for bonding. The target plate 14 is then moved into an interlayer deposition chamber 150 by the substrate transfer system 300, preferably into a sputtering chamber, where an interlayer 6 approximately 1.0 micron thick is deposited on the cleaned surface of the target plate 14 by sputtering a target 15 (FIG. 8) in the chamber. The backing plate 12 and target material plate 14 are then transferred by the substrate transfer system to a bonding chamber 200, where they are joined, under heat and pressure, such that the clean surface of the backing plate 12 is joined to the interlayer coated surface of the target material plate 14 to form a unitary target assembly 1 which is then removed from the bonding chamber 200 for use.

THE WORKPIECE TRANSFER ASSEMBLY: AN OVERVIEW

The workpiece transfer assembly is provided in the vacuum handling tool 10 to move the workpieces, such as the backing plate 12 and the target material plate 14, within the various chambers in the vacuum handling tool 10. Referring generally to FIG. 2, the individual, non-bonding, chambers of the vacuum handling tool 10 are provided in two intersecting paths leading to the bonding chamber 200, such that the target material plate 14, and the backing plate 12, each pass through a plurality of dedicated process chambers as they are prepared for bonding. The workpiece transfer assembly is provided to move the backing plate 12 and target material plate 14 through the intersecting paths, and it includes therefore a plurality of sets of rollers 302 (best shown in FIGS. 3, 4, and 8) disposed in each of the loadlock and process chambers, and a pair of magnets 303 disposed on either side of each of the sets of loadlock and process chambers and moveable along the exterior of the aligned chambers. Sets of rollers 302 are provided on either side of each of the two loadlock chambers 400, 402, the two cleaning chambers 100, 102, the interlayer deposition chamber 150, and the bonding chamber 200. To magnetically couple the backing plate 12 and the target material plate 14 to the magnets 303, magnetic clips, or other similar devices, are attached to the sides of the backing plate 12 and the target material plate 14 before they are loaded into the vacuum handling tool 10.

To move the backing plate 12 and target material plate 14 between the aforementioned chambers, the isolation slit valves, selectively closing the workpieces transport path, between adjacent chambers are opened, and the magnets 303 on the exterior of the chambers are moved linearly along the aligned chambers to magnetically drag the backing plate 12 and the target material plate 14 over the rollers 302 and thus through the loadlock and processing chambers. Once the backing plate 12 or the target material plate 14 is received in the proper location in the next chamber in the aligned chambers, movement of the magnets 303 is stopped to prevent further movement of the backing plate 12 or target material plate 14. To move the magnets 303 to precisely position the backing plate 12 and the target plate 14, the magnets 303 may be configured as nuts received over lead screws, or other linear positioning means, in order to change the linear position of the magnets 303 on the sides of the chambers.

THE LOAD LOCK CHAMBER CONFIGURATION

The individual chambers of the vacuum handling tool 10 are preferably maintainable in isolation from the conditions existing outside of the chambers, so as to reduce the pumping needed to maintain the chambers at the proper vacuum pressure for processing. Therefore, each chamber in the vacuum handling tool preferably includes an isolation valve at the individual chamber inlet and outlet. Therefore, either load lock chamber 400 or 402 is provided with vacuum slit valves at either end and vacuum pumps.

Figure 3:
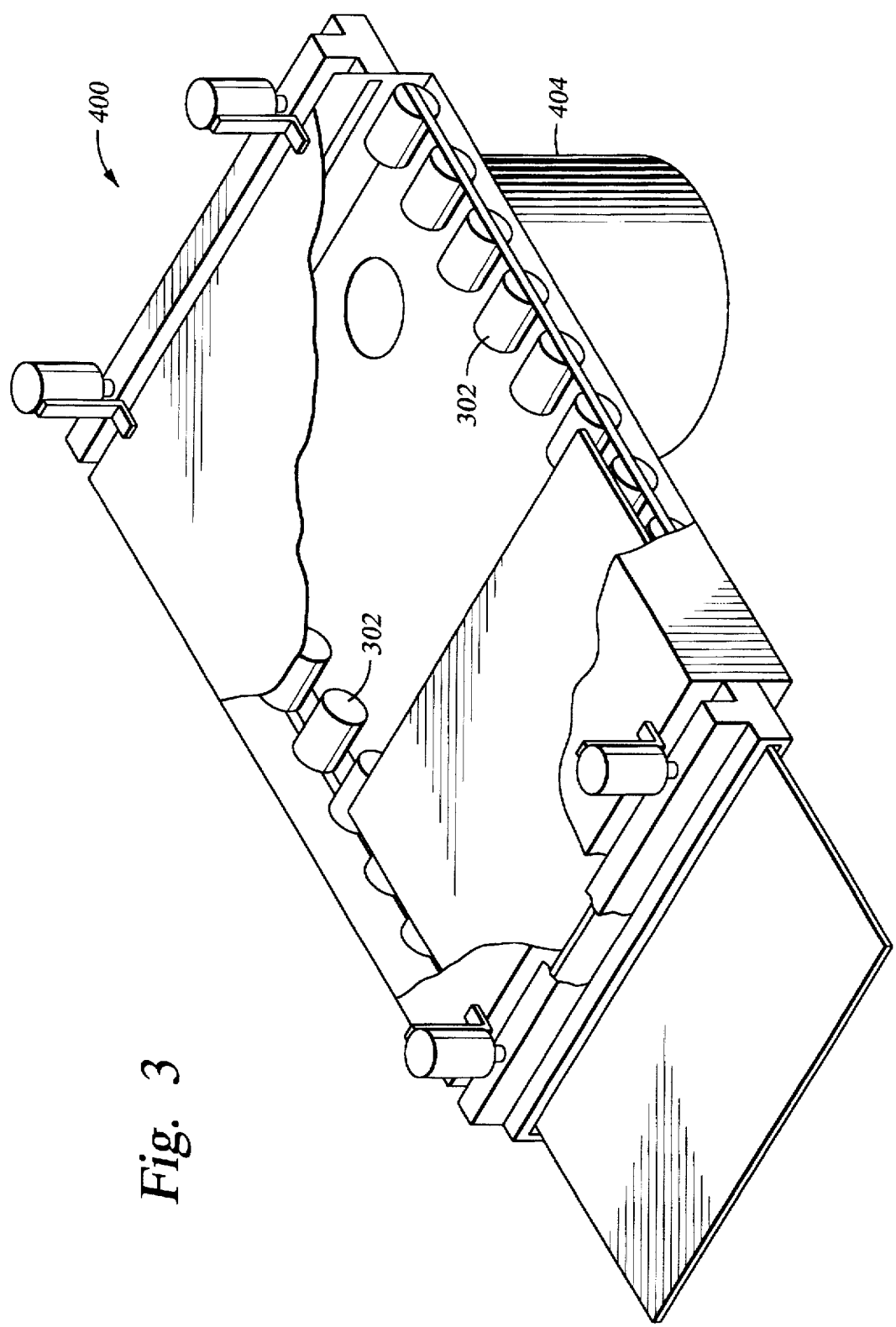
FIG. 3 is a perspective view, partially in section, of the loadlock chamber of the vacuum handling tool of FIG. 2.

Referring now to FIG. 3, the construction of load lock chamber 400 is shown. The preferred configuration of load lock chamber 402 is identical to that of load lock chamber 400. The load lock chamber 400 is ported to a vacuum pump 404, such as a cryogenic or turbo pump, capable of pumping the chambers 400, 402 down to a pressure on the order of $10^{-4}$ to $10^{-8}$ torr. The vacuum pump is configured to pump the vacuum chamber 400 to this vacuum after each backing plate 12 or target material plate 14 is loaded into the respective load lock chamber 400, 402. To increase the cycle time of the vacuum handling tool 10, the backing plates 12 are preferably loaded into the load lock chamber 400 from workpiece cassettes (not shown) capable of holding multiple workpieces, i.e., multiple target material plates 14 and backing plates 12, in a vacuum environment. Thus, the load lock chambers 400, 402 need not be pumped down to the aforementioned vacuum pressure from atmospheric pressure after each target material plate 14 and backing plate 12 is loaded into its respective load lock chamber 400 and 402. A robot paddle, well known in vacuum handling tools for processing flat panels, can transfer workpieces between the system and the cassettes.

THE SPUTTER CLEANING CHAMBER

Figure 4:
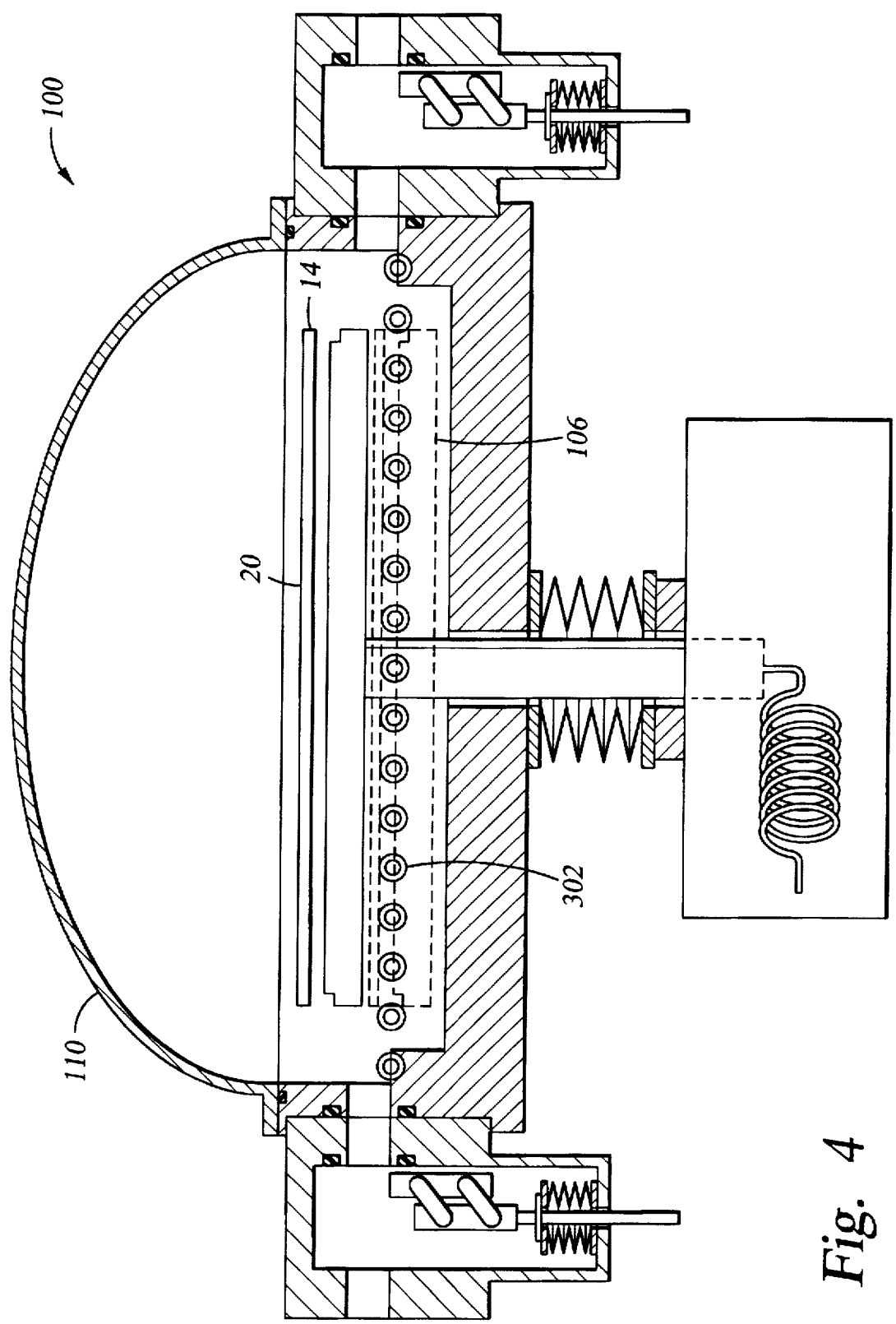
FIG. 4 is a sectional view of the cleaning chamber of the vacuum handling tool of FIG. 2 at 4—4 showing the target material plate positioned therein for the cleaning of the upper surface of the target material plate thereof.
Figure 5:
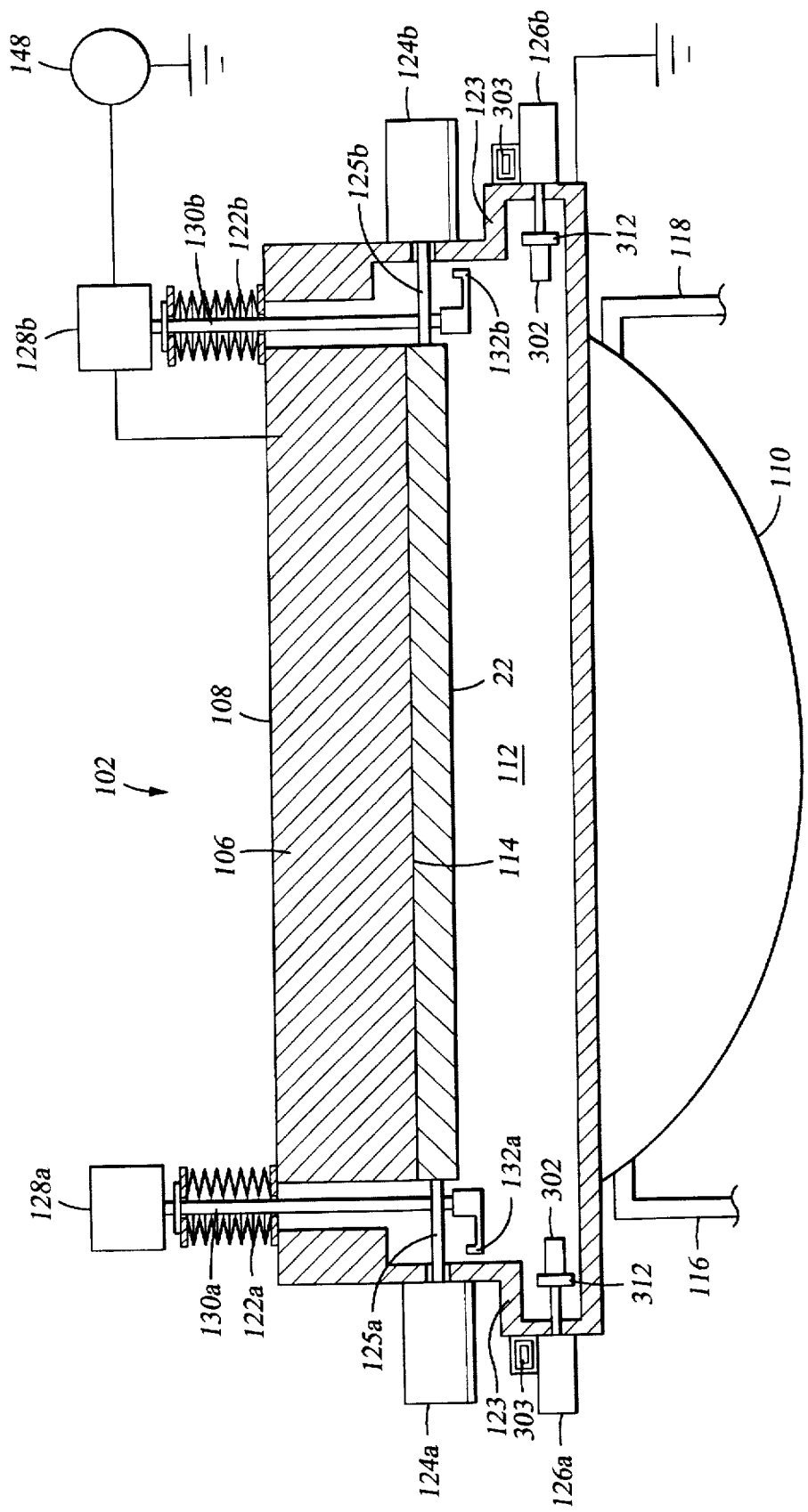
FIG. 5 is a sectional view of the cleaning chamber of FIG. 2 at 5—5 showing the backing plate suspended in the chamber for cleaning of the underside thereof.

Referring now to FIGS. 4 and 5, the details of construction of the target-material-plate and backing-plate cleaning chambers 100 and 102 respectively are shown. The vacuum handling tool 10 is preferably configured to prepare the upper surface of the target material plate 14 and the lower surface of the backing plate 12 for joining. This necessitates cleaning the underside of the backing plate 12 by suspending the backing plate 12 in the cleaning chamber 102. Except as noted herein, the operation and construction of the target-material-plate cleaning chamber 100, shown in FIG. 2, is identical to that of the backing-plate cleaning chamber 102. The main difference between the backing-plate cleaning chamber 102, and the target-plate cleaning chamber 100, is that the cleaning action, i.e., ion bombardment, is maintained below the backing plate in the backing-plate cleaning chamber 102, whereas the cleaning action is maintained above the target material plate 14 in the target-plate cleaning chamber 100. Thus, the target material plate 14 is cleaned on the upper surface 20 (FIG. 1) thereof in the target-material-plate cleaning chamber 100, and the bottom surface 22 (FIG. 1) of the backing plate 12 is cleaned in the backing-plate cleaning chamber 102. Thus, when the backing plate 12 and the target material plate 14 are ultimately joined in the bonding chamber 200, their cleaned surfaces will adjoin one another without the need to turn one of the target material plate 14 or backing plate 12 over before it is placed in the bonding chamber 200.

Backing-plate cleaning chamber 102 includes a bell housing 110 (FIG. 5) extending downwardly from a base 112, a roller support member 312 selectively extendable from each of the sides of the chamber 102, a cathode 106 disposed between the rollers 302 and the chamber cover 108, and a gas inlet 116 (shown only in FIG. 5) and a gas outlet 118 (shown only in FIG. 5). Additionally, the chamber 102 includes isolation valves at the chamber inlet and outlet, which are maintained in a closed position except when a backing plate 12 is being moved into, or from, the chamber 102.

To move the backing plate 12 into the cleaning chamber 102 for processing, the backing plate 12 is first loaded into the load lock chamber 402 and onto the aforementioned opposed sets of rollers 302. The isolation valve between the load lock chamber 402 and the cleaning chamber 102 is opened, and the magnets 303 are moved to roll the backing plate 12 on the rollers 302 and into the cleaning chamber 102.

Once the backing plate 12 is positioned in the cleaning chamber 102, the rollers 302 must be moved out of their position beneath the backing plate 12 to allow the full width of the underside of the backing plate 12 to be sputter cleaned. However, the rollers 302 support the backing plate 12 as it is rolled into the chamber 102, and therefore a secondary means must be provided to support the backing plate 12 in the chamber 102. To provide this support, the backing plate cleaning chamber 102 includes a plurality of backing plate lifter apparatuses 122a–d (two of which are shown in FIG. 5, all four shown in FIG. 2), a plurality of backing plate suspension members 124 a–d (a portion of all four shown in FIG. 2) and a plurality of roller retraction members 126a–d (a portion of all four shown in FIG. 2) connected, through the side walls of the backing-plate cleaning chamber 102, to the rollers 302. A pocket 123 is provided on either side of the backing-plate cleaning chamber 102, into which the rollers 302 may be retracted by the retraction members 126a–d during cleaning operations as will be further described herein.

Figure 7:
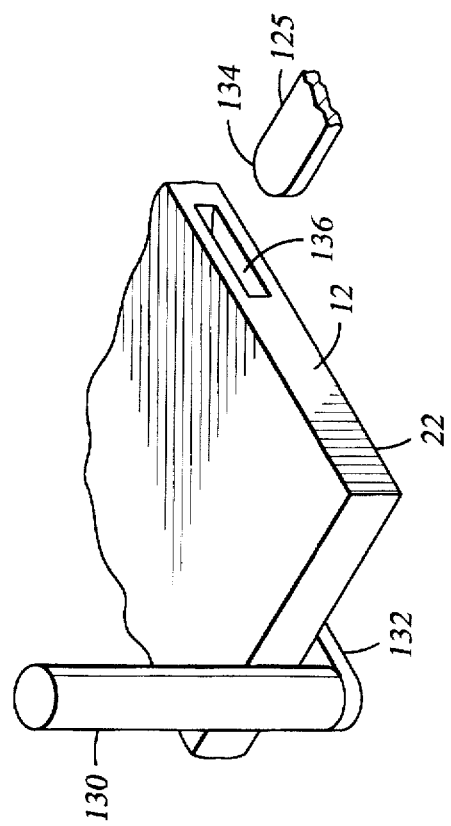
FIG. 7 is an additional partial perspective view of the backing plate support system of the cleaning chamber of FIG. 5.
Figure 6:
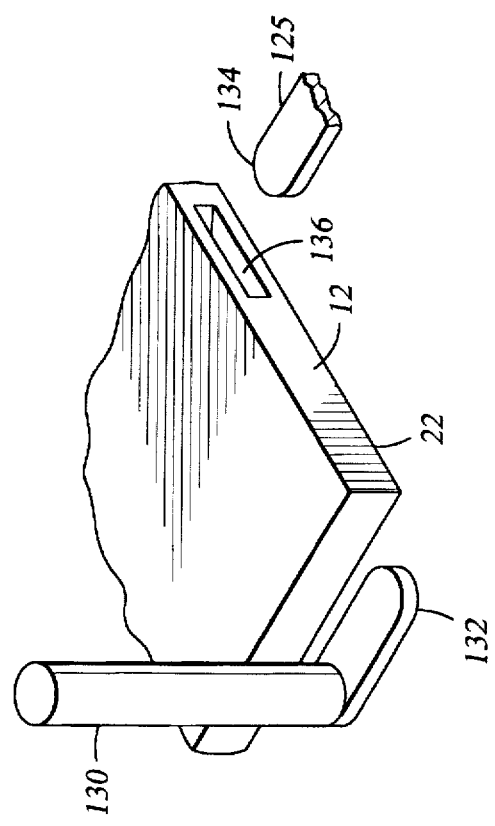
FIG. 6 is a partial perspective view of the backing plate support system of the cleaning chamber of FIG. 5.

As best shown in FIGS. 5, 6 and 7, to properly position the backing plate 12 in the backing-plate cleaning chamber 102, the lifter apparatuses 122 include lift actuators 128 a–d (two of which are shown in FIG. 5) and lifter rods 130a–d (two of which are shown in FIG. 5) terminating inwardly of the chamber 102 in a lifting blade 132a–d. Once the backing plate 12 is properly positioned in the backing-plate cleaning chamber 102 by the magnets 303, the lift actuators 128 move the lift rods 130 from the retracted position shown in FIG. 5 downwardly to a position wherein the upper surface of the blades 132 are located adjacent an end of the backing plate 12 and below the lower surface 22 of the backing plate 12 as shown in FIG. 6. The actuators 128 (not shown in FIGS. 6 and 7) then rotate the lifter rods 130 to position at least a portion of the blades 132 under the backing plate 12 as shown in FIG. 7, and the actuators then move the lifter rods 130 upwardly to lift the backing plate 12 off the rollers 302 and to the position of the backing plate 12 shown in FIG. 5. Once the backing plate 12 is suspended in the chamber 102 by the lifter apparatuses 122, the rollers 302 are moved into pockets 123 in each of the side walls of the backing plate sputter clean chamber 102 by the roller retraction members 126.

To ensure that the entire surface of the underside 22 of the backing plate 12 is sputter cleaned, the backing plate suspension members 124 are configured and positioned to support the backing plate 12 by its sides, so that the lifter blades 132 may be removed from the underside of the backing plate 12 during the sputter clean operation as shown in FIG. 5. Preferably, the suspension member 124 includes a plurality of suspension blades 125 having a semicircular engagement end 134 (shown in FIGS. 6 and 7), and the backing plate 12 includes a plurality of semicircular slots 136 (shown in FIGS. 6 and 7) in the sides thereof. When the backing plate 12 is lifted from the rollers 302, and pressed against the cathode 106, the suspension members 125 are moved inwardly from the sides of the backing plate cleaning chamber 102, such that their semicircular ends 134 are received in the slots 136 in the sides of the backing plate 12. The blades 125 support the backing plate 12 within the backing plate cleaning chamber 102, so that the lifting blades 132 may be removed from the underside 22 of the backing plate 12 and retracted such that the entire underside 22 of the backing plate 12 may be exposed to the plasma for cleaning.

To clean the underside 22 of the backing plate 12, a gas is flowed into the chamber 102 through the gas inlet 116 and the total chamber pressure is maintained at a desired pressure in the range of $10^{-3}$ to $10^{-4}$ torr by throttling the chamber exhaust 118. A voltage source, preferably an r.f. power supply 148, is wired directly to the cathode 106, and the chamber walls are grounded. Preferably, the lower surface 144 of the cathode 106 is nearly as large as the surface 22 of the backing plate 12. When the r.f. power supply supplies an r.f. voltage to the backing plate 12 which is pressed against the cathode 106, it excites the gas in the chamber 102 into an etch or cleaning plasma. This plasma cleans the lower surface 22 of the backing plate 12.

The target-material-plate cleaning chamber 100 (FIG. 4) is in all respects identical to the backing-plate cleaning chamber 102, except that in the target-material-plate cleaning chamber 100 the rollers 302 are fixed in position within the chamber, i.e., they may roll but are not retracted into the chamber walls, instead, the cathode 106 is lifted against the target material plate 14, and the target material plate 14 is supported by the cathode 106 while the upper surface 20 of the target material plate 14 is sputter cleaned.

Although the movement of the backing plate 12 through the backing-plate cleaning chamber 102 has been described wherein the backing plate 12 rides directly on the rollers 302, it may be desirable to provide rails, or other attachment members, to the sides of the backing plate 12. These rails, and not the underside 22 of the backing plate 12 being cleaned in the chamber 102, would ride on the rollers 302 so as to prevent contact of the underside 22 of the backing 12 with the rollers 302. These rails could also provide the magnetic coupling with the magnets 303, and they could also be used in conjunction with the target material plate 14 to provide the magnetic coupling of the target material plate 14 with the magnets 303.

THE INTERLAYER DEPOSITION CHAMBER

The vacuum handling tool 10 of the present invention preferably includes a single deposition chamber 150 to provide a material interlayer 6 on the target material plate 14. For purposes of illustration, the process is described with respect to forming the interlayer on the target material plate 14, although the backing plate 12 may receive the interlayer 6. Additionally, if desired, the vacuum handling tool 10 may include an additional deposition chamber to form an interlayer on each of the target material plate 14 and backing plate 12. Where three or more workpieces are joined, multiple interlayer deposition chambers are specifically contemplated to provide interlayers on multiple workpieces, or on multiple sides of individual workpieces.

Figure 8:
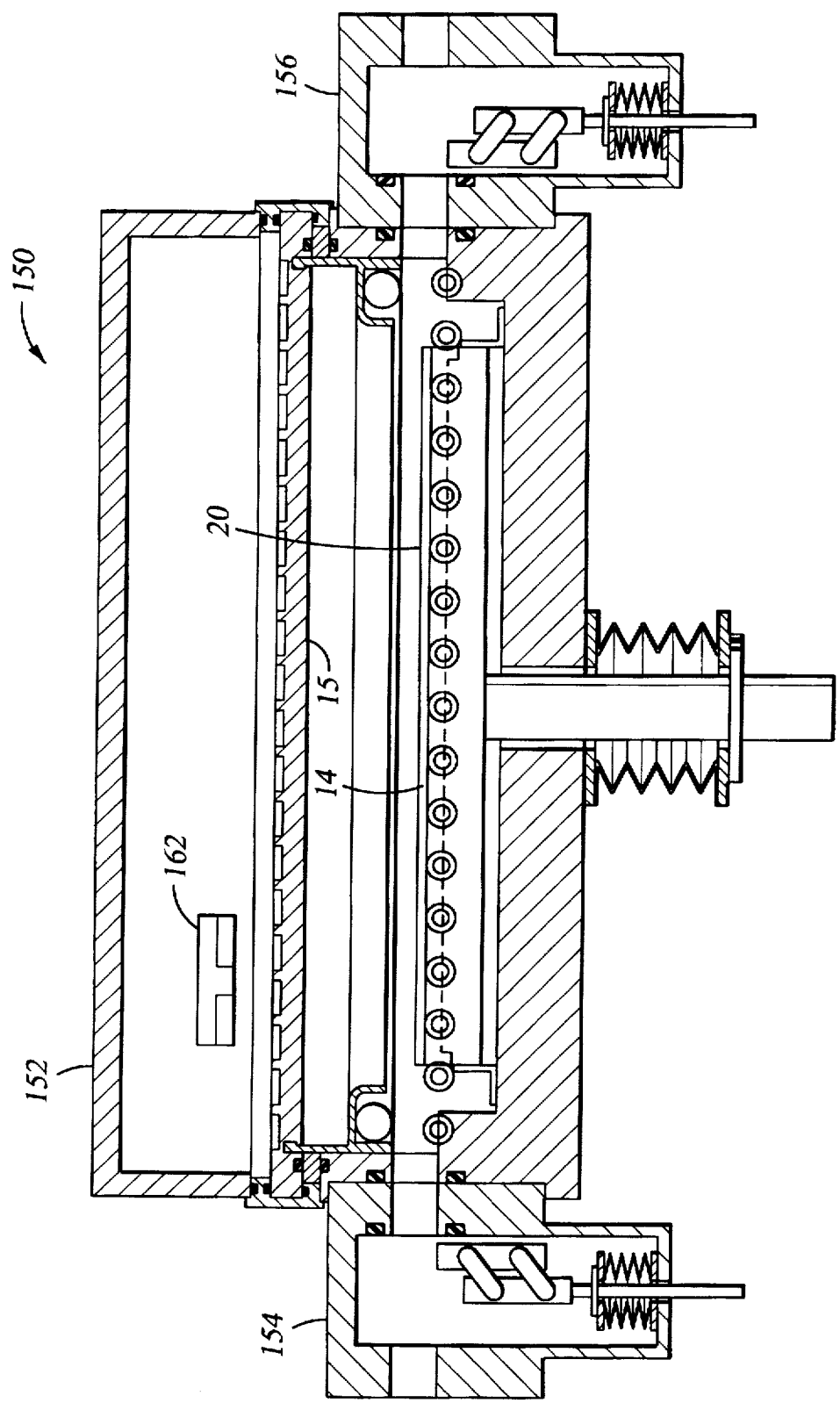
FIG. 8 is a sectional view of the deposition chamber of the vacuum handling tool of FIG. 2 at 8—8.

The interlayer deposition chamber 150 is shown in section in FIG. 8, and it is preferably configured as a sputter deposition chamber, i.e., a chamber in which a material is sputtered from a target 15 maintained in the chamber and deposited on the upper surface 20 of the target material plate 14. A similar chamber for sputter depositing flat glass panels is disclosed in the aforementioned patents to Demaray et. al. The chamber 150 includes an interlayer deposition chamber inlet 154 linked through the cleaning chamber isolation valve to the cleaning chamber 100 (as shown in FIG. 2) and an interlayer deposition chamber outlet 156 linked to an isolation valve located between the interlayer deposition chamber 150 and the bonding chamber 200 (as shown in FIG. 2). The target 15 is enclosed by the cover 152 of the interlayer deposition chamber 150, and a workpiece transfer member, preferably the opposed sets of the rollers 302 and the magnets 303, is used to move the target material plate 14 into the bonding chamber 200. The cleaning chamber 100 and interlayer deposition chamber 150 are preferably maintained at the same pressure, so that the isolation valve primarily serves to prevent contamination between the chambers during the processing of the target material plate 14 in the individual chambers of the vacuum handling tool 10. A high vacuum pump (not shown) is ported to the deposition chamber to maintain the deposition chamber 150 at high vacuum pressure.

To form the interlayer on the target material plate 14, the interlayer deposition chamber 150 is first pumped to high vacuum, preferably between $10^{-8}$ to $10^{-9}$ torr, and a non-reactive gas species, preferably argon, is charged into the interlayer deposition chamber 150 to raise the chamber pressure up to approximately $10^{-3}$ to $10^{-4}$ torr. The target 15 is maintained at a negative d.c. voltage while the chamber walls are grounded, which energizes the argon into a plasma. The argon ions in this plasma bombard the target 15 and sputter atoms or larger particles of target material 15 as the argon ions hit target 15. Preferably, the target 15 is configured in combination with a magnetron 162 to form a magnetron sputtering apparatus. Where the workpiece is a large rectangular member such as the target material plate 14, the magnetron 162 preferably sweeps linearly across the back of the target 15 to distribute the plasma ion concentrating effect of the magnetron 162 over essentially the entire surface of the target 15.

Once the interlayer 6 has been formed on the target material plate 14, the backing plate 12 and the target material plate 14 may be joined. However, where the materials being joined are highly oxidizable, oxygen in the interlayer deposition chamber 150 or in the bonding chamber 200 will rapidly form an oxide layer on the fresh interlayer 6 and on the freshly cleaned underside of the backing plate 12. To remove these oxide layers, an oxygen-getter gas such as CO is charged into the bonding chamber 200 to create an oxygen gettering environment on the clean backing plate 12 and interlayer 6 surfaces. Preferably, sufficient CO is maintained in the chamber to create a ratio of CO to $CO_2$ in the chambers of $10^8$ to $10^9$. At these conditions, the free CO will getter the free oxygen in the chamber at a sufficiently rapid rate to remove the oxide layer from the backing plate 12 and interlayer 6 on the target material plate 14. The CO combines or strips the oxygen from the surfaces to form $CO_2$ which is then pumped away by a vacuum pump (not shown) ported on the bonding chamber 200.

THE BONDING CHAMBER

Figure 9:
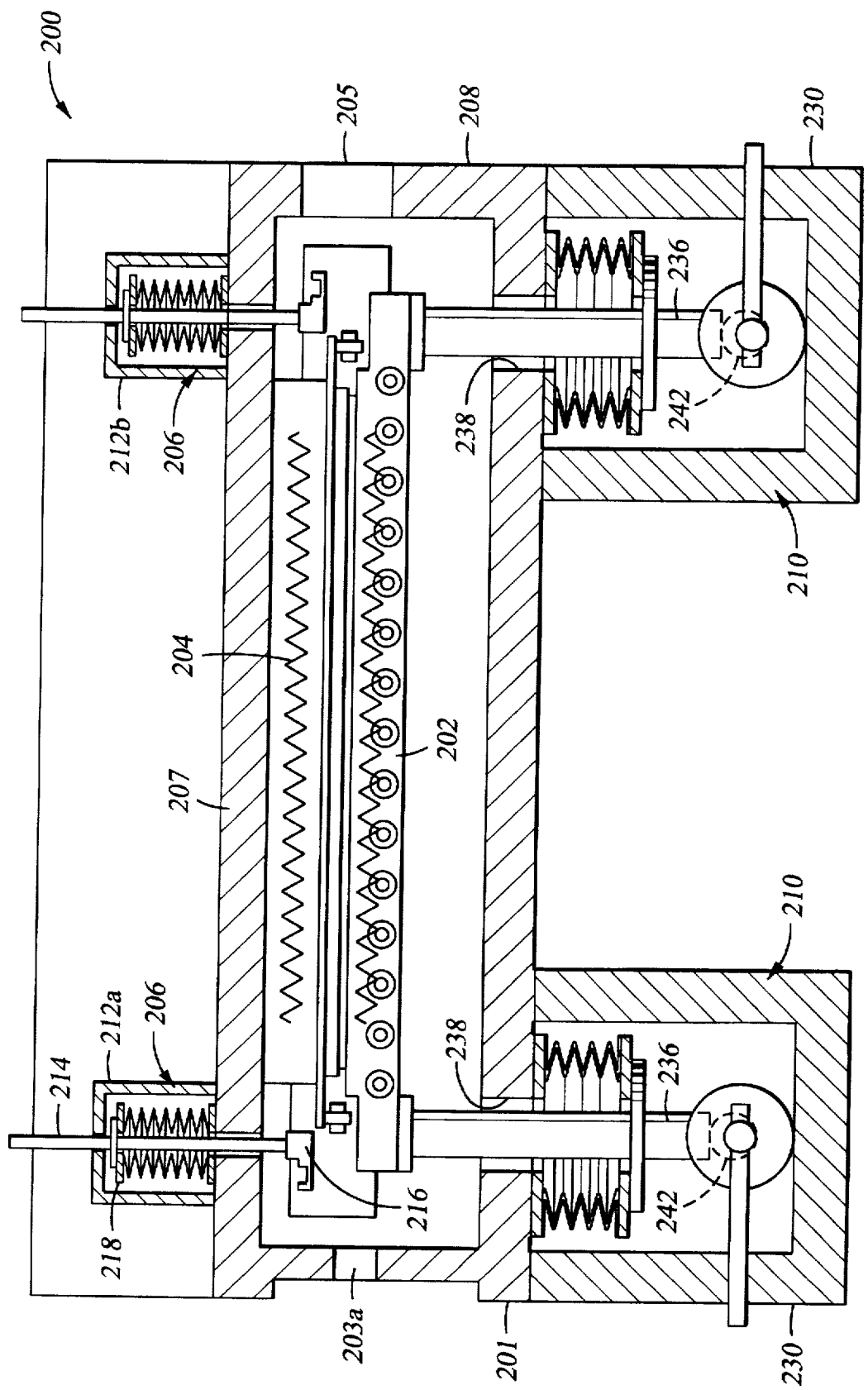
FIG. 9 is a sectional view of the bonding chamber of the vacuum handling tool of FIG. 2 at 9—9.

Once the interlayer 6 is formed on the target material plate 14, the backing plate 12 and the target material plate 14 are rolled into the bonding chamber 200 for bonding. Referring now to FIG. 9, the bonding chamber 200 is preferably configured as a vacuum enclosure having a base 201, an outer wall 208 having at least two inlet slit valves 203a, 203b (not shown) and an outlet slit valve 205 extending therethrough, and a rib-stiffened cover 207. The vacuum enclosure surrounds a first platen 202 selectively positionable within the chamber 200, a second platen 204 disposed above the first platen and fixed to the cover 207 of the chamber 200. A backing plate manipulator 206 and a platen loading assembly 210 are also provided.

The backing plate manipulator 206 is provided to support the backing plate 12 in an elevated position within the bonding chamber 200, to permit placement of the target material plate 14 under the backing plate 12 after the backing plate 12 is loaded into the bonding chamber 200. The backing plate manipulator 206 preferably includes a plurality of linearly actuable support members 212a–d which are selectively extendable from the outside surface of the rib-stiffened cover 207 of the chamber 200. Each of the support members 212a–d includes a stem 214 extending through the chamber cover 207. The interior end of the stem 214 terminates in a hook portion 216. A bellows 218 extends about the portion of each respective stem 214 extending from the chamber cover to prevent leakage past the position where the stem 214 extends through the chamber cover 207, and a motor, not shown, is coupled to the upper portion of each stem 214 extending through the bellows 218.

As the backing plate 12 is placed into the bonding chamber and onto the first platen 202, the stems 214 of the manipulator 206 are turned to locate the hook portions 216 under the backing plate 12. The motor is engaged to lift the backing plate 12 upwardly in the chamber 200, and the target material plate 14 is then placed on the first platen 202 by rolling the target material plate 14 into the bonding chamber 200 on the rollers 302, such that the upper surface 20 of the target material plate 14 faces the lower surface 22 of the backing plate 12. Once the target material plate 14 is aligned under the backing plate 12, the stems 214 are actuated downwardly to lower the backing plate 12 onto the target material plate 14 supported on the rollers 302, and the stems 214 are then turned to free the hooks 216 from interference with free movement of these two workpieces 12, 14 in the bonding chamber 200.

Figure 10:
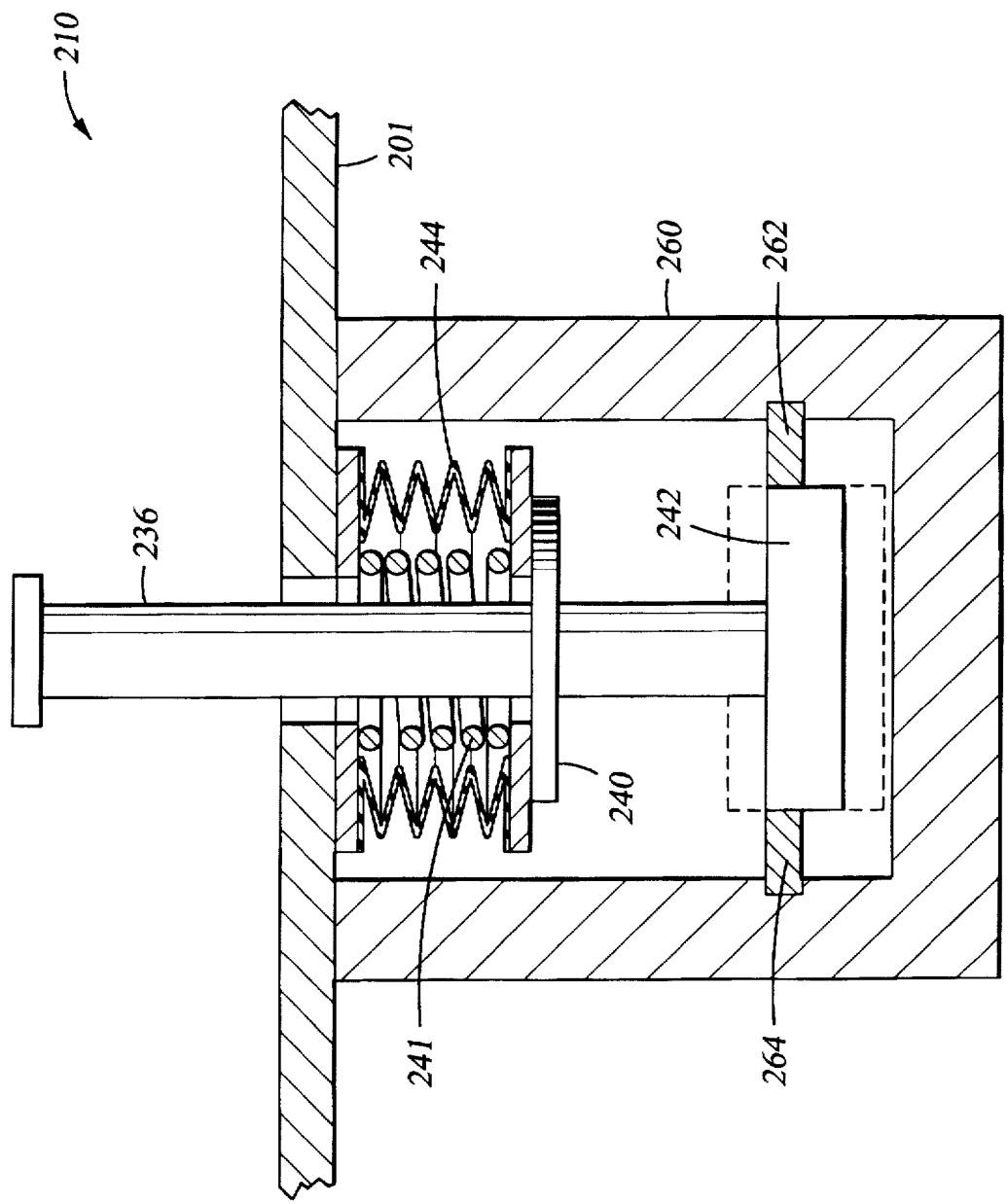
FIG. 10 is a sectional view of a loading member of the bonding chamber of FIG. 9.

Once the backing plate 12 and target material plate 14 are properly positioned in the bonding chamber 200, the lower platen 202 is moved upwardly in the chamber 200 by the platen loading assembly 210 to lift the target material plate 14 off the rollers 302 and to force the backing plate 12 and the target material plate 14 together against the upper platen 204. In the preferred embodiment, the loading assembly 210 includes a plurality of ram members 230. Referring now to FIGS. 9 and 10, each of the ram members 230 include an internally heated rod 236 extending outwardly of an aperture 238 in the base of the chamber 200 and received against a cam 242 (best shown in FIG. 10.) Additionally, a bearing plate 240 extends circumferentially outwardly from the rod 236 intermediate of the upper end of the rod 236 and the cam 242. A bellows 244 extends from the underside of the base of the chamber 200 to the bearing plate 240 to seal each of the apertures 238, and a spring 241 extends from the underside of the base of the chamber 200 to the bearing plate 240 to bias the rod 236 outwardly of the chamber 200.

The ram members 230 each include a housing 260 disposed on the exterior of the chamber 200, into which a pair of opposed, aligned, spindles 262, 264 (shown in FIG. 10) are piloted. Each of the spindles 262, 264 terminates inwardly of the housing 260 in a cam 242 (a portion of shown in phantom in FIG. 10) extending between the inner ends of the spindles 262, 264. The cam 242 is preferably a solid cylindrical member. The end of the rod 236 extending from the chamber 200 rides directly against the outer cylindrical surface of the cam 242, and the rod 236 is spring biased inwardly of the housing 260 with the spring 241 to maintain the end thereof extending from the chamber 200 in contact with the cam 242. The spindles 262, 264 are joined to the cam 242 in a position which is offset from the central axis of the cam 242. Thus, as the spindles 262, 264 are rotated, the position of the surface of the cam 242 engaged against the end of the rod 236 changes with respect to the chamber 200 base, thereby allowing movement of the rod 236 inwardly and outwardly of the chamber 200.

To provide the conditions necessary to cause diffusion bonding between the interlayer 6 and the upper surface 20 of the target material plate 14 and the lower surface 22 of the backing plate 12, the interlayer 6 and the upper surface 20 of the target material plate 14 and the lower surface 22 of the backing plate 12 must be forced together under heat and pressure. To provide the desired bonding temperature, each of the platens 202, 204 is heated, preferably with an electrical resistance wire heater located in each of the platens 202, 204, to allow rapid attainment of a bonding temperature after the backing plate 12 and target material plate 14 are received in the bonding chamber 200. To provide the desired load for bonding, the rods 236 of the ram members 230 are configured to initially position the lower surface 22 of backing plate 12 against the interlayer 6 coated upper surface of the target material plate 14, and then load the adjacent surfaces of the backing plate 12 and the target material plate 14.

In the preferred embodiment of the invention, the load force for diffusion bonding is provided by thermal expansion of the resistance-heated platens 202 and 204 and also by heating the rods 236 with resistance wire heaters located therein or thereon, thereby also causing the rods 236 to thermally expand. Since the rods 236 are fixed against linear expansion between the cams and the surfaces of the platens 202 or 204, the rods 236 will become compressively loaded against the platens 202 and 204 as their temperature is increased by the heaters. As a result, the backing plate 12 and the target material plate 14 become loaded together by an amount sufficient, at the elevated temperature created by the heaters in the platens 202, 204, and the rods 236, to provide a diffusion bond between the target material plate 14 and the backing plate 12. To ensure that the load created at the lower surface 22 of the backing plate 12 and the interlayer 6 coated upper surface 20 of the target material plate 14 is uniform, additional ram members 230 may be provided to additionally load the underside of the lower platen 202. Also, ram members 230 may be provided to additionally load the upper surface of the upper platen 204.

Each backing plate 12 and target material plate 14 may be comprised of the same or different materials, including base materials and alloys, brittle materials, or may themselves be bi-metallic members if desired. For example, where the target assembly 1 is used to deposit tantalum onto a flat panel substrate, the backing plate 12 is preferably titanium or a titanium alloy, the target material plate 14 being tantalum. These materials may be interconnected by diffusion bonding using the methods and apparatus disclosed herein. Preferably, the interlayer 6 material formed on the target material plate 14 is composed of the material from which the backing plate 12 is fabricated or any other high-diffusivity alloy thereof, or the interlayer is formed of a relatively soft, conformal, material such as aluminum where the titanium-made backing plate 12 can readily diffuse. In each instance, the sputtered interlayer 6 adheres metallurgically to the target material plate 14. Therefore, the interlayer 6 forms a continuous metallurgical extension of the upper surface 20 of the target material plate 14. Additionally, the interlayer 6 is used to provide a more uniform bonding surface on the upper surface 20 of the target material plate 14. Typically, to provide relatively flat bonding surfaces on the target material plate 14 and backing plate 12, the two plates are ground on a grinder, such as a blanchard grinder, to a finish of approximately 0.40 microns (16 pinches) with a surface peak to valley height of approximately 1.2 microns. By depositing an interlayer having a thickness of approximately 1 micron, the valleys between the peaks of the ground upper surface 20 of the target material plate are substantially filled to provide a more uniform upper surface 20 of the target material plate 14 for bonding.

Figure 11:
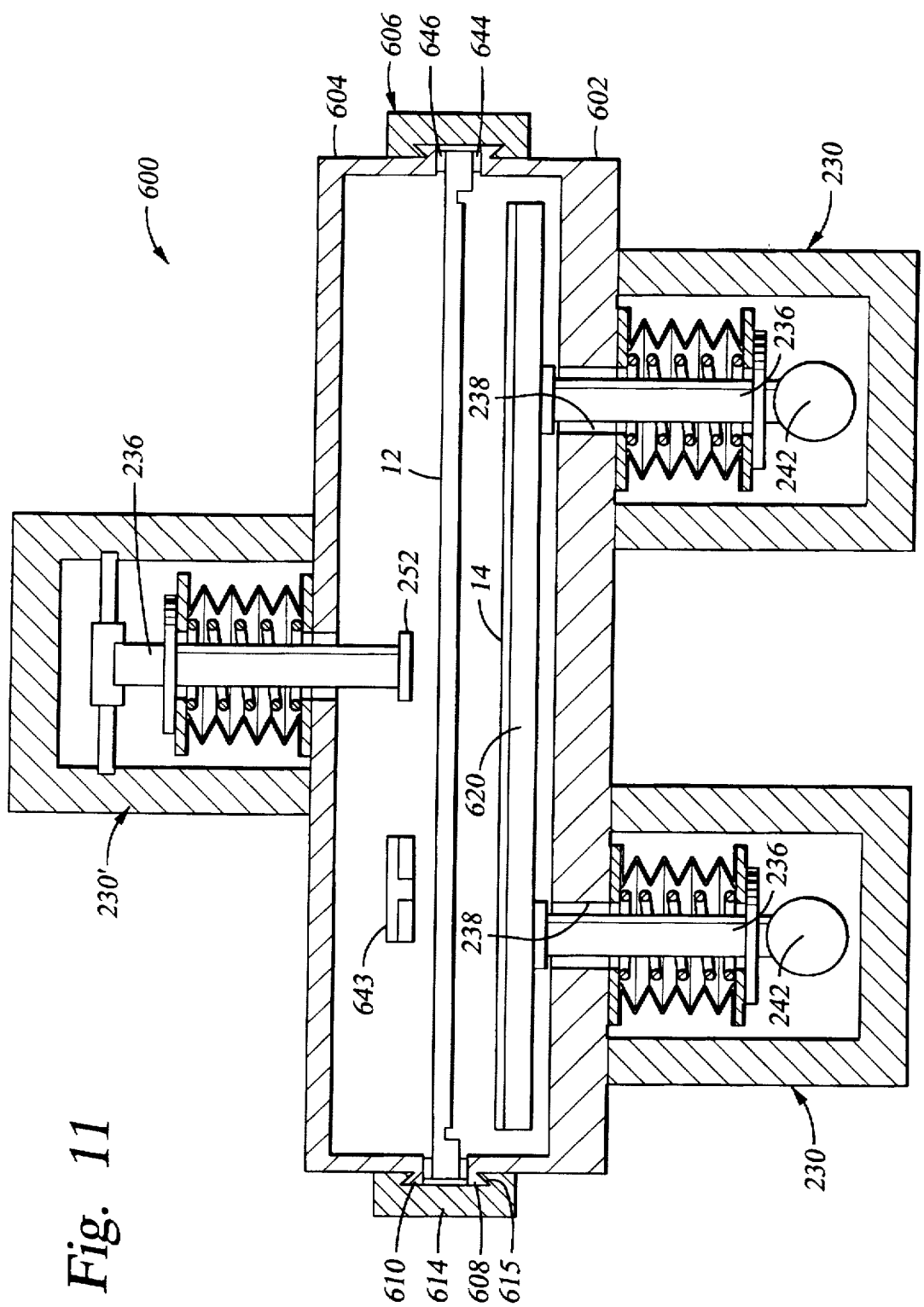
FIG. 11 is a sectional view of an alternative embodiment of the bonding chamber of the present invention in the sputter position.
Figure 12:
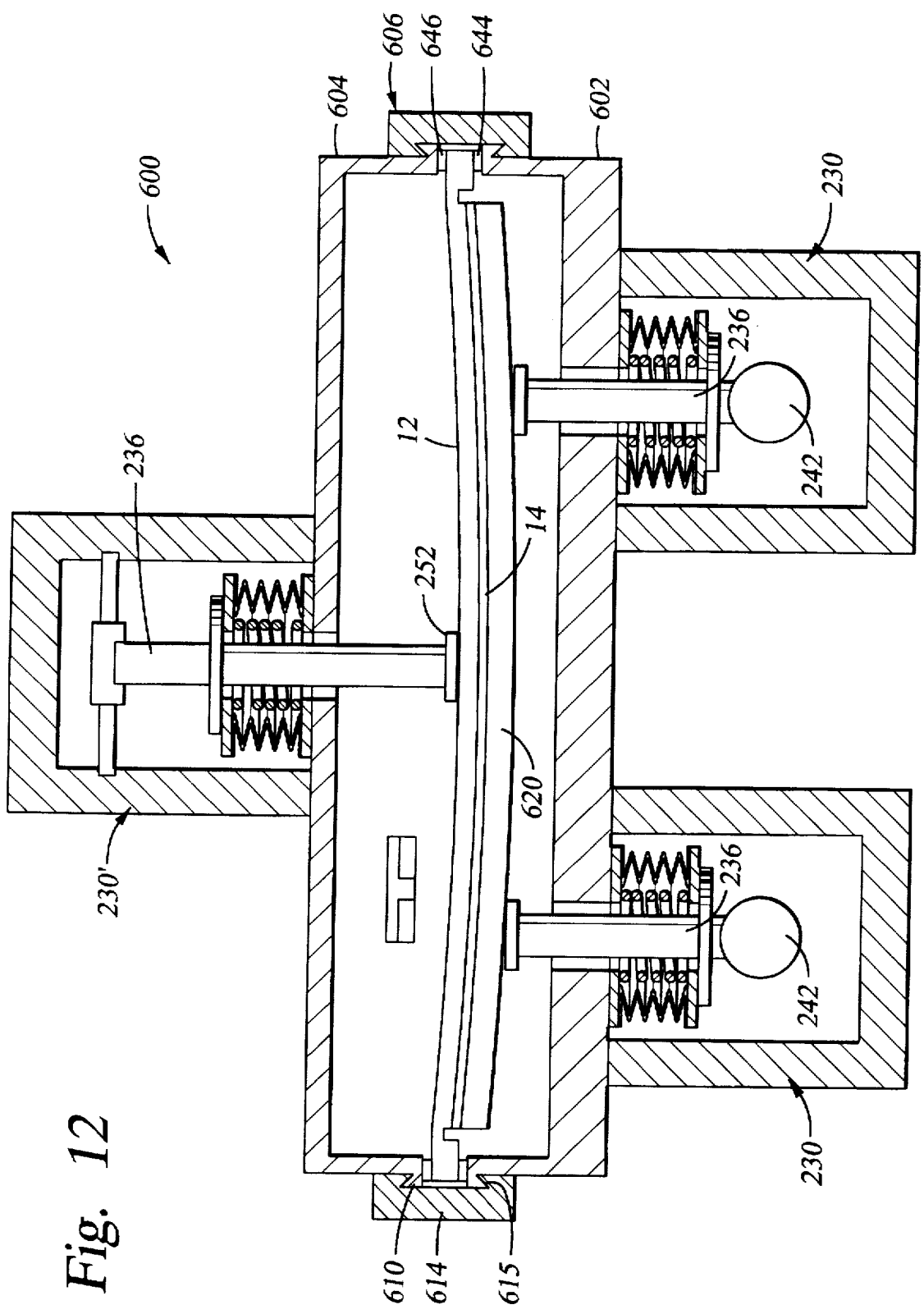
FIG. 12 is a sectional view of the alternative embodiment of the bonding chamber of FIG. 10 shown in the bonding position.

Referring now to FIGS. 11 and 12, an alternative embodiment of the bonding chamber of the present invention is shown, in which the process of cleaning and joining the target material plate 14 to the backing plate 12 requires only one unitary process chamber 600 in which cleaning, sputter depositing and bonding are performed. The unitary process chamber 600 generally includes a base 602 and a cover 604, joined at a sealing flange connection 606. The sealing flange connection 606 includes a lower flange 608 extending outwardly from the upper edge of the base 602, an upper flange 610 extending outwardly from the lower edge of the cover 604, and a plurality of clamp members 614 engaged over both flanges 608, 610 to secure the flange in connected engagement. The base 602 further includes a platen 620 movably supported in the base on a plurality of ram members 230 (previously described herein with respect to the bonding chamber 200) which may be actuated to reciprocate the platen 620 between a retracted, or lowered, position as shown in FIG. 11, and an extended, or lifted, position as shown in FIG. 12. Each of the ram members 230 include the internally heated rod 236 extending outwardly of an aperture 238 in the base 602 of the chamber 600 and received against a cam 242.

The cover 604 of the chamber 600 is attached to the aforementioned flanged connection 606, and further includes an upper ram member 230' and a magnetron structure 643. Upper ram member 230' has the same configuration as the ram members 230, except that the heated rod 236 thereof terminates in a load plate 252 disposed inwardly of the chamber 600.

In this alternative embodiment of the invention, the backing plate 12 is used as a sputtering target to form a freshly sputtered material layer on the target material plate before the target material plate 14 and the backing plate 12 are diffusion bonded together. To form the target assembly 1 in the chamber 600, the target material plate 14 is placed on the platen 620 with the bonding surface 20 thereof exposed. A lower conformable, electrically insulating seal 644 is placed over the lower flange 608 of the chamber 600, and the flange 22 of the backing plate 12 is loaded over the first conformable seal 644 such that the backing plate 12 edge does not extend outwardly beyond the outer perimeter of the flange 608. To energize the backing plate 12, a conductive strap (not shown) is affixed to the top side of the backing plate 12, such as by forming a terminal at the end of the strap and attaching the strap to the backing plate 12 with a threaded fastener. An upper conformable, electrically insulating seal 646 is then placed over the top edge of the backing plate 12, and the chamber cover 604 is then placed over the second conformable seal 646.

To secure the cover 604 over the chamber 600 lower flange 608, each of the lower flange 608 and the upper flange 610 are semi-dovetail shaped in profile. The clamps 614 include a dovetail groove 615 therein, which allows the clamps 614 to be slid over the upper and lower flanges to affect a clamp induced seal at the flanges 608, 610. The clamps need only be sufficiently tight so as to allow the chamber to be pumped down to a vacuum pressure. As the chamber 600 is evacuated, the vacuum pressure exerted on the chamber cover and base will further load the flanges 608, 610 together to ensure the maintenance of a seal. The seals 644, 646, in addition to the gap between the edge of the backing plate 12 and the ends of the flanges 608, 610, allow the backing plate 12 to be electrically biased with respect to the base 602 and cover 604 of the chamber 600 and hence with respect to the target material plate 14.

By extending the backing plate 12 over the upper end of the chamber 600 and isolating it from the base 602 and cover 604, the backing plate 12 may be used as a sputtering target to form an interlayer on the target material plate 14 comprised of the backing plate material. To sputter the backing plate 12 and the target material plate 14, a gas is introduced to an evacuated chamber (vacuum pump not shown) formed by the base 602 with the backing plate 12 of chamber 600, and the gas is excited into a plasma by an r.f. power supply as in the sputter cleaning chambers 100, 102 to provide ions to sputter clean the surfaces of both the target material plate 14 and the backing plate 12. Then, after the sputter cleaning step is completed, a negative d.c. voltage is applied to the backing plate 12 to sputter the backing plate and deposit a layer, or interlayer 6, of the backing plate material on the exposed surface of the target material plate 14. Once an interlayer of a sufficient thickness has been deposited on the upper surface 20 of the target material plate 14, the d.c. power is discontinued and cams 242 of the ram members 230 are operated to force the platen 620 upwardly to bring the interlayer coated surface of the target material plate 14, hot still from the fresh deposition, into contact with the sputtered surface of the backing plate 12, also hot by the sputter action. Simultaneously, the ram member 230' on the cover 604 of the bonding chamber 600 is forced inwardly of the bonding chamber 600 by its cam to apply a force on the upper platen 252 to prevent excessive bending of the target material plate 14 and backing plate 12 as they are bonded. Then, the internal heaters in the rods 236 are activated, to create the thermal loading of the backing plate 12 and the target material plate 14 caused by thermal expansion of the rods 236. Because the interlayer 6 is freshly formed on the target material plate 14 in the same chamber 600 within which the bonding is performed, the bonding can be accomplished within seconds of the deposition of the interlayer in an oxygen excluding environment enabling joining of the backing plate 12 and the target material plate 14 at relatively low pressures and temperatures.

FIGS. 11 and 12 also show a further aspect of the invention wherein the ram members 230, 230' may be used, in conjunction with the heat of bonding, to provide target assemblies 1 having predictable thermal deformation characteristics. For example, where a titanium backing plate 12 is bonded to a tantalum target material plate 14, differences in the coefficients of thermal expansion of the two materials can cause the target assembly 1 to become warped as it is cooled from an elevated bonding temperature to room temperature. To reduce this warpage, the present invention specifically contemplates deforming the target material plate 14 and backing plate 12 at the elevated bonding temperature in the direction opposite to the cooling warpage, as shown in FIG. 12, and allowing the target assembly 1 to return to a flat profile as it cools from the elevated bonding temperature to room temperature. This may be provided automatically, by allowing the rods 236 of the ram members 230, 230' to differentially load the upper and lower sides of the target assembly 1, and thereby induce a bend or warp in the target assembly at the elevated temperature, but provide no differential load, and thus no bend or warp, in the target assembly 1 at an ambient temperature. The warp-free target assembly 1 is made by plastically deforming the softer interlayer 6, i.e., aluminum, using the differential load of the ram rods 236 during the cooling cycle, hence a thermally stable target asssembly 1 may be manufactured.

Using the methods of the present invention, and maintaining the plates 12, 14 in a vacuum as the plates are cleaned, interlayered and bonded, bonding temperatures and pressures can be greatly reduced compared to prior art bonding temperatures and pressures. For example, when bonding a tantalum target plate 14 to a titanium backing plate 12 using an aluminum interlayer 6 by the methods of the present invention, a joint of greater strength than conventional solder joints can be accomplished at 350° C. and 1.0 MPa (145 psi). The primary differences between the prior art and the present invention which allow this significant change are the elimination of oxides or other undesirable surfaces on the bonding surface of the workpieces being joined, and the deposition of a relatively uniform thickness, relatively soft interlayer on one of the two plates 12, 14. Therefore, the bonding surfaces of the plates 12, 14, or of other workpieces, may be easily brought into intimate contact at much lower pressures as compared to the prior art.

The present invention is also well suited to manufacturing structures such as sputtering targets 1 at lower cost than the prior art. First, the amount of interlayer material, such as aluminum, which must be placed on the mating faces of the workpieces is significantly less than that required in the prior art, because the variation in thickness of the interlayer is minimal. Further, the diffusion bond between backing plate 12 and the target material plate 14 of the present invention has stronger tensile and shear strengths than the solder joints of the prior art. Additionally, the process is well suited to easy recycling of target assemblies 1 in which the backing plate 12 has a higher melting temperature than the target material plate 14. To recycle target assemblies 1, or other workpieces, the used target assembly is placed into a furnace and the remaining portion of the target material plate 14 is melted from the target assembly 1, leaving behind the backing plate 12. The backing plate 12 is then chemically cleaned, and loaded into a cleaning chamber 100 for re-processing. Thus, the backing plate 12 portion of the target assembly 1 is recyclable, and only the target material plate 14 need be replaced to build a new target assembly 1. Also, the target material plate 14 may be machined or ground off and the backing plate 12 may be re-processed as previously discussed.

The methods and apparatuses of the present invention are also useful for decreasing the number of defective structures, such as the target assembly 1, being manufactured, and also increase the flexibility in the types and configurations of the materials being joined. In particular, the materials forming the workpieces may have substantially different coefficients of thermal expansion, or may have discrete portions thereof which have significantly different coefficients of thermal expansion, and these materials may be used interchangeably in the same press without significantly changing the final configuration of the part. Also, brittle-type target material plates 14 may be bonded by the methods described in the present invention since some sputtered films can adhere metallurgically to the brittle-type target material plate 14, and the low-temperature diffusion bonding process described herein, will subject the workpieces to compressive loads, a loading suitable for brittle materials.

We claim:

1. A method of bonding at least a first planar workpiece to a second workpiece at bonding surfaces thereof to form a monolithic member, comprising:

cleaning the bonding surfaces of the workpieces in a non-oxidizing cleaning environment;

depositing an interlayer on at least one of the workpiece bonding surfaces in a non-oxidizing environment; and joining the workpiece surfaces under heat and pressure in a non-oxidizing environment to form a diffusion bond between the workpieces at the bonding surfaces;

whereby the workpieces are continually maintained in a non-oxidizing environment during the steps of cleaning, depositing an interlayer on, and joining the workpiece surfaces; and wherein the environment includes an oxygen gettering gas therein during at least some of said cleaning, depositing and joining steps.

2. The method of claim 1, wherein said oxygen gettering gas includes carbon monoxide.

3. A method of bonding at least a first planar workpiece to a second workpiece at bonding surfaces thereof to form a monolithic member, comprising:

cleaning the bonding surfaces of the workpieces in a non-oxidizing cleaning environment;

depositing an interlayer on at least one of the workpiece bonding surfaces in the non-oxidizing environment; and joining the workpiece surfaces under heat and pressure in a non-oxidizing environment to form a diffusion bond between the workpieces at the bonding surfaces, wherein the step of joining the workpiece surfaces includes the further step of forcing the workpieces into contact at their bonding surfaces by providing an equal load on each workpiece at an ambient temperature;

whereby the workpieces are continually maintained in a non-oxidizing environment during the steps of cleaning, depositing an interlayer on, and joining the workpiece surfaces.

4. The method of claim 3, wherein the load is supplied to the workpieces by contacting at least one retractable rod with each of the workpieces.

5. A method of bonding at least a first planar workpiece to a second workpiece at bonding surfaces thereof to form a monolithic member, comprising:

cleaning the bonding surfaces of the workpieces in a non-oxidizing cleaning environment;

depositing an interlayer on at least one of the workpiece bonding surfaces in a non-oxidizing environment; and joining the workpiece surfaces under heat and pressure in a non-oxidizing environment to form a diffusion bond between the workpieces at the bonding surfaces, wherein the step of joining the workpiece surfaces includes the further step of contacting multiple rods with each of the workpieces;

whereby the workpieces are continually maintained in a non-oxidizing environment during the steps of cleaning, depositing an interlayer on, and joining the workpiece surfaces.

6. A method of bonding at least a first planar workpiece to a second workpiece at bonding surfaces thereof to form a monolithic member, comprising;

cleaning the bonding surfaces of the workpieces in a non-oxidizing cleaning environment;

depositing an interlayer on at least one of the workpiece bonding surfaces in a non-oxidizing environment;

joining the workpiece surfaces under heat and pressure in a non-oxidizing environment to form a diffusion bond between the workpieces at the bonding surfaces, wherein the steps of cleaning, depositing and joining are achieved in a single chamber;

configuring one of the workpieces as a sputtering target in a vacuum enclosure;

locating a second of the workpieces in the vacuum enclosure; and sputtering the first of the workpieces to deposit a layer of material sputtered from the first of the workpieces onto a second of the workpieces;

whereby the workpieces are continually maintained in a non-oxidizing environment during the steps of cleaning, depositing an interlayer on, and joining the workpiece surfaces.

7. The method of claim 6, wherein the first of the workpieces is a backing plate for a sputtering target assembly, and the second of the workpieces is a target material plate for a target assembly.

8. The method of claim 7, including the further step of moving the target material plate into engagement with the backing plate after sputtering the backing plate.

9. The method of claim 8, including the further step of selectively heating a platen in the vacuum enclosure to support the target material plate in the chamber as the backing plate is sputtered and for moving the target material plate into contact with the backing plate after the backing plate is sputtered.

10. An apparatus for diffusion bonding the joining surfaces of at least a first and a second workpiece, comprising:

at least one cleaning chamber for cleaning the joining surfaces of the workpieces;

at least one film layer deposition chamber for forming a film layer on at least one of the cleaned surfaces;

at least one bonding chamber for bonding the workpieces together at their joining surfaces under heat and pressure;

isolation valves interconnecting the cleaning, deposition and bonding chambers to permit transfer of the workpieces to atmospheric conditions;

a first platen and a second platen received in said bonding chamber, the first workpiece receivable on said first platen to bring the joining surface of the first workpiece into engagement with the joining surface of the second workpiece;

a load member engagable against said second platen and positionable to move said second platen to bring the joining surface of the first workpiece into engagement with the joining surface of the second workpiece;

a second load member disposed in engagement with said first platen;

said load member and said second load member include load rods thereon; and a heating means for heating each of said load rods in said load member and said second load member.

11. The apparatus of claim 10, wherein the heating means is capable of maintaining the temperature of the load rods in the load member at a different temperature than that of the load rods in the second load member.

12. The apparatus of claim 10, wherein a coefficient of thermal expansion of said load rods of said load member is different than a coefficient of thermal expansion of said load rods of said second load member.

13. A method of joining a sputtering target assembly from at least a target material plate and a backing plate, comprising the steps of:

forcing the target material plate and the backing plate together at joining surfaces thereof under heat and pressure to enable diffusion bonding at the joining surfaces; and bending the target material plate and the backing plate at the diffusion bonding temperature and allowing the target assembly formed by bonding the target material plate to the backing plate to change shape as it cools to an ambient temperature.

14. The method of claim 13, further comprising depositing a joining interlayer onto the joining surface of one of said target material plate and said backing plate previous to said forcing step.

15. The method of claim 14, wherein the target material plate and the backing plate include planar joining surfaces; and the joining interlayer is distorted by the step of bending the target material plate and backing plate at the diffusion bonding temperature and the joining surfaces return to a planar profile when the target assembly returns to an ambient temperature.

16. The method of claim 15, wherein said joining interlayer is not exposed to an oxidizing environment prior to and during said forcing and bending steps.

* * * * *